United States Patent
Chang

(10) Patent No.: US 9,684,121 B2
(45) Date of Patent: Jun. 20, 2017

(54) SIDE-EDGE BACKLIGHT MODULE HAVING NON-UNIFORMLY SIZED BACKLIGHT SECTIONS AND DESIGN METHOD THEREOF

(75) Inventor: Kuangyao Chang, Guandong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 728 days.

(21) Appl. No.: 13/698,039

(22) PCT Filed: Aug. 3, 2012

(86) PCT No.: PCT/CN2012/079632
§ 371 (c)(1),
(2), (4) Date: Nov. 14, 2012

(87) PCT Pub. No.: WO2014/015535
PCT Pub. Date: Jan. 30, 2014

(65) Prior Publication Data
US 2014/0029304 A1   Jan. 30, 2014

(30) Foreign Application Priority Data

Jul. 27, 2012 (CN) .......................... 2012 1 0264250

(51) Int. Cl.
*F21V 21/30* (2006.01)
*F21V 8/00* (2006.01)
(Continued)

(52) U.S. Cl.
CPC ........... *G02B 6/0078* (2013.01); *G06F 17/50* (2013.01); *G02B 6/0073* (2013.01);
(Continued)

(58) Field of Classification Search
CPC .. G02B 6/0073; G02B 6/0078; G02B 6/0076; G02B 27/22; G02B 27/2228;
(Continued)

(56) References Cited

U.S. PATENT DOCUMENTS 7,597,468 B2 * 10/2009 Weng ................ H05B 33/0803
349/61
8,089,582 B2 *  1/2012 Sekiguchi ............ G02B 6/0038
349/65
(Continued)

FOREIGN PATENT DOCUMENTS

CN       102375243 A      3/2012
CN       102413349 A      4/2012
(Continued)

*Primary Examiner* — Jong-Suk (James) Lee
*Assistant Examiner* — James Endo
(74) *Attorney, Agent, or Firm* — Andrew C. Cheng

(57) ABSTRACT

A side-edge backlight module having non-uniformly sized backlight sections and a design method thereof. The backlight module includes backlight sections that have relative sizes satisfying the condition that the backlight sections have higher ranks are of greater sizes. Ranking the backlight sections is made by conducting an simulation operation for a process of sectionalized lighting of backlight to display liquid crystal panel signals on the basis of uniformly sized backlight sections and conducting analysis of the number of zones where an interference signal appears and distance of the interference signal when each of backlight sections is lit in the simulation operation on the basis of uniformly sized backlight sections and ranking the backlight sections according to strength of cross-talking caused by the interference signal so that a backlight section having less strong crosstalking is set with a higher rank.

3 Claims, 7 Drawing Sheets sections of odd number (five sections)

| first backlight section | small |
| second backlight section | intermediate |
| third backlight section | large |
| fourth backlight section | intermediate |
| fifth backlight section | small | sections of even number (four sections)

| first backlight section | second |
| second backlight section | first (maximum) |
| third backlight section | third |
| fourth backlight section | fourth |

(51) Int. Cl.
  *G06F 17/50* (2006.01)
  *G02B 27/22* (2006.01)
  *G09G 3/34* (2006.01)

(52) U.S. Cl.
  CPC .......... *G02B 6/0075* (2013.01); *G02B 6/0076* (2013.01); *G02B 27/22* (2013.01); *G02B 27/2228* (2013.01); *G09G 3/342* (2013.01); *G09G 3/3426* (2013.01); *G09G 2310/024* (2013.01); *G09G 2310/0237* (2013.01); *G09G 2320/0209* (2013.01)

(58) Field of Classification Search
  CPC .... G02B 27/225; G02B 6/0075; G09G 3/342; G09G 3/3426; G09G 2320/0209; G09G 3/3406; G09G 2320/0646; G09G 2310/0237; G09G 2310/024; H04N 2213/001; H04N 13/0418
  USPC .............. 362/602, 612, 616, 97.1–97.4, 613; 345/87, 102, 39; 349/15
  See application file for complete search history.

(56) References Cited

U.S. PATENT DOCUMENTS

| | | | | |
|---|---|---|---|---|
| 2007/0120765 A1* | 5/2007 | Misonou | ................ | G09G 3/342 345/38 |
| 2007/0188677 A1* | 8/2007 | Souk | .................... | G02B 6/0078 349/65 |
| 2008/0030650 A1* | 2/2008 | Kitagawa | ............. | G02B 6/0068 349/65 |
| 2008/0084512 A1* | 4/2008 | Brott | .................... | G02B 6/0061 349/15 |
| 2008/0150884 A1* | 6/2008 | Ito | ..................... | G02F 1/133606 345/102 |
| 2009/0103006 A1* | 4/2009 | Cadio | ............... | G02F 1/133615 349/64 |
| 2009/0167990 A1* | 7/2009 | Konno | ................ | G02B 6/0078 349/65 |
| 2010/0328362 A1* | 12/2010 | Song | .................... | G02B 6/0038 345/690 |
| 2011/0037685 A1 | 2/2011 | Park et al. | | |
| 2011/0069091 A1* | 3/2011 | Kim | .................... | G09G 3/3426 345/690 |
| 2011/0115828 A1* | 5/2011 | Seo | ........................ | G09G 3/342 345/690 |
| 2012/0050339 A1* | 3/2012 | Huang | ................... | G09G 3/342 345/690 |
| 2012/0081624 A1 | 4/2012 | Kobayashi et al. | | |
| 2012/0098875 A1* | 4/2012 | Shinkai | ............... | G02B 6/0036 345/690 |
| 2012/0105441 A1* | 5/2012 | Park | ........................ | G09G 3/342 345/419 |
| 2012/0113155 A1* | 5/2012 | Fang | .................... | G02B 6/0055 345/690 |
| 2012/0162281 A1* | 6/2012 | Cho | ........................ | G09F 13/04 345/690 |

FOREIGN PATENT DOCUMENTS

| | | | | |
|---|---|---|---|---|
| JP | | 2012053367 A | 3/2012 | |
| JP | WO | 2013124895 A1 * | 8/2013 | .......... G02B 6/0048 |
| WO | | 2011148663 A | 12/2012 | |

* cited by examiner sections of odd number (five sections)

| | |
|---|---|
| first backlight section | small |
| second backlight section | intermediate |
| third backlight section | large |
| fourth backlight section | intermediate |
| fifth backlight section | small |

Fig. 7A sections of even number (four sections)

| | |
|---|---|
| first backlight section | second |
| second backlight section | first (maximum) |
| third backlight section | third |
| fourth backlight section | fourth |

Fig. 7B

1 — conducting an simulation operation for a process of sectionalized lighting of backlight to display liquid crystal panel signals on the basis of uniformly sized backlight sections according to predetermined liquid crystal panel signals and backlight scanning timing 2 — conducting analysis of the number of zones where an interference signal appears and distance of the interference signal when each of backlight sections is lit in the simulation operation on the basis of uniformly sized backlight sections and ranking the backlight sections according to strength of cross-talking caused by the interference signal when each of the backlight sections is lit so that a backlight section having less strong cross-talking is set with a higher rank 3 — providing a higher-rank backlight section with a relatively larger size

Fig. 8

SIDE-EDGE BACKLIGHT MODULE HAVING NON-UNIFORMLY SIZED BACKLIGHT SECTIONS AND DESIGN METHOD THEREOF

CROSS REFERENCE TO RELATED APPLICATIONS

This application claims priority to Chinese Application Serial Number 201210264250.7, filed Jul. 27, 2012, which is incorporated herein by reference in its entirety.

BACKGROUND OF THE INVENTION

1. Field of the Invention

The present invention relates to liquid crystal displaying techniques, and in particular to a side-edge backlight module having non-uniformly sized backlight sections and a deign method thereof.

2. The Related Arts

The fast development of LED television is now getting into a new era of 3D liquid crystal television. Among the 3D liquid crystal televisions, one of the most commonly used techniques is the shutter glasses 3D displaying technique, in which separate display of signals for left and right eyes is done with sectionalized illumination of backlighting and is used in combination with synchronous flashing of eyeglasses to make the left and right eyes perceiving different images. The shutter glasses 3D displaying technique applies image processing technology to provide a visual effect to human eyes that looks like a stereoscopic movie, which generally comprises alternately supplying signals of left-eye frames and right-eye frames to a liquid crystal panel in order to drive the liquid crystal panel to separately form left-eye images and right-eye images. This, when combined with illumination of a scanning backlight unit and timing control of the shutter glasses, allows the left-eye signals and the right-eye signals to respectively simulate the left eye and the right eye, making a person perceive a 3D image.

However, the 3D liquid crystal display devices have a drawback that since the liquid crystal panel does not emit light by itself, backlighting must be provided to serve as a light source. Due to the consideration of cost factor, sectionalization of the backlight cannot be made very fine. As shown in FIG. 1, a schematic view showing sectionalized lighting and light leakage of a conventional side-edge LED backlight is given. The side-edge LED backlight comprises LED chips that are arranged along circumferential edges of a liquid crystal panel and a light guide plate is included to allow the LED backlight to be lit in a sectionalized manner for conducting light emitting from the circumferential edges of the liquid crystal display panel through the light guide plate to reach a central zone of the liquid crystal display panel. This provides sufficient backlighting entirely, allowing the liquid crystal display panel to display images. The side-edge LED backlight has two advantages. One is that less LED chips can be used and cost is lowered down. The other is that it is possible to make a device body thin by not arranging LED modules on the back side of the liquid crystal panel of LED television but at lateral sides so as to reduce the overall thickness of the liquid crystal panel and thus make the device body extremely thin.

FIG. 1 shows a backlighting section 11 that is of light incidence at a right side short edge. Asymmetry of light leakage is because leakage gets severer with the longer light path. When the backlighting section 11 is lit, light leaks to the sections 12 and 13 on the opposite sides thereof and this causes interference between left-eye and right-eye signals. In other words, the left eye may perceive the signal for the right eye (or the right eye sees the signal for the left eye) and this makes image blurred (for the two signals show distributions that overlap in space). The criterion for assessing image blurring is cross-talking, of which a higher value indicates severer interference. Thus, it is an important issue to reduce cross-talking while maintaining price competitiveness for products.

The cross-talking occurring between a left-eye signal and a right-eye signal of the conventional shutter glasses 3D displaying technique is determined by the technical nature thereof. The backlight module of the conventional shutter glasses liquid crystal 3D display is arranged to form an even number of backlighting sections by dividing a horizontal block in a vertical direction and scanning is carried out from top to bottom to sequentially control activation and operation time for each backlighting section of the backlight module. Image signals (left-eye signals and right-eye signals) sequentially supply, from top to bottom, driving voltages to each row of the liquid crystal panel. Only after pixels receive and are charged by the driving voltages, the liquid crystal panel starts to respond. Due to the design of pixel and the viscosity of liquid crystal, a complete steady state can only be reached after a period of liquid crystal response time. Since liquid crystal responds slowly, image signals are displayed on a liquid crystal panel in a sectionalized scanning fashion. When an image signal scans one of the sections of the liquid crystal panel, the corresponding section of backlight will be set on and the remaining backlight sections are off. Since leakage exists in the backlight sections, when light leaking from a backlight section corresponding to a left-eye signal irradiates a backlight section corresponding to a right-eye signal (or when light leaking from a backlight section corresponding to a right-eye signal irradiates a backlight section corresponding to a left-eye signal), the eyes will simultaneously perceive the left-eye image and the right-eye image, causing cross-talking. The right-eye signal or the left-eye signal that causes cross-talking will be referred to as an error signal (or interference signal).

As shown in FIGS. 2A and 2B, schematic views illustrating sectionalized lighting of backlight for a 46-inch single short edge side-edge LED television are given. Taking the 46-inch single short edge side-edge LED television as an example, the backlight module 20 is often divided into an even number backlight sections, such as four sections, for sectionalized lighting. An edge side backlight section 21, once lit, leaks toward the middle, while a middle backlight section 22, once lit, leaks toward opposite sides.

As shown in FIG. 3, a schematic view showing nine points on a liquid crystal panel where cross-talking is measured. In FIG. 3, a display screen 30 has adjacent sizes of which the dimensions are respectively denoted by reference symbols H and V. The nine points, namely point 1, point 2, . . . , and point 9, are arranged according to the relative positioning relationship as shown in FIG. 3. The locations of point 1, point 2, . . . , and point 9 on the display screen are exactly the locations on the liquid crystal panel. Measurements are made on a conventional LED television with 46-inch single short edge incidence and four backlight section scanning and the detected cross-talks at the nine points of point 1, point 2, . . . , and point 9 are listed in the following Table 1, which clearly indicates that the cross-talking shows a characteristic of vertical asymmetry, with the upper side being much severer than the lower side. In addition, these cross-talks also show horizontal asymmetry.

This is caused by the single short edge incidence, where the further the optic path goes, the severer the leakage will be

TABLE 1

Cross-Talks Measured at Nine Points (46" single short side incidence and four backlight section scanning)

| single short edge incidence | Left 1/9 | Middle 1/2 | Right 8/9 |
|---|---|---|---|
| Upper 1/9 | 14.99% | 8.84% | 7.03% |
| Middle 1/2 | 5.60% | 4.51% | 3.69% |
| Lower 8/9 | 8.47% | 6.20% | 4.81% |

Due to the arrangement of backlight sections, timing coordination among liquid crystal panel signals, glasses signals, and backlight scanning often result in asymmetry of cross-talking. The data of Table 1 reveal that for a conventional 46-inch single short edge side-edge LED television, the left-eye signal or the right-eye signal shows an image of the best quality on the middle portion of the liquid crystal panel and the quality of image displayed on the liquid crystal panel is generally unsymmetrical in the vertical direction. The vertical asymmetry of cross-talking shown in Table 1 can be explained with the timing relationship between the backlight sections and the liquid crystal panel signals.

As shown in FIG. 4, a schematic view is given to illustrate the timing relationship (a left-eye signal being used for demonstration) between the backlight sections of a conventional 46-inch single short edge side-edge LED television and the liquid crystal panel signals (the left-eye image and the right-eye image signal applied to the liquid crystal panel). The backlight module is divided, sequentially from top to bottom, into a first backlight section 41, a second backlight section 42, a third backlight section 43, and a fourth backlight section 44, which respectively function to illuminate first, second, third, and fourth display sections of a liquid crystal panel 40. In FIG. 4, a left-eye signal is taken as an example for demonstrating four successive steps of the operations of the liquid crystal panel 40 and the backlight module for displaying liquid crystal panel signals: step a, in which the first to third display sections are loaded with a left-eye signal of the current frame and the fourth display section is loaded with a right-eye signal of the previous frame; the first backlight section 41 is lit to illuminate the first display section and since leakage from the first backlight section 41 might undesirably illuminate the fourth display section, the right-eye signal of the previous frame loaded in the fourth display section becomes an error signal of cross-talking with the left-eye signal of the current frame loaded in the first display section; since the first display section and the fourth display section are spaced from each other by two display sections therebetween and the distance is great, the cross-talking so caused is minor; step b, in which the fourth display section is also loaded with the left-eye signal of the current frame so that at this moment, the liquid crystal panel 40 is entirely loaded with the left-eye signal; the second backlight section 42 is lit to illuminate the second display section; at this moment, leakage from the second backlight section 42 does not cause cross-talking between the left-eye signal and the right-eye signal, providing the best image quality; step c, in which the first display section is loaded with a right-eye signal of the next frame and the second to fourth display sections are loaded with the left-eye signal of the current frame; the third backlight section 43 is lit to illuminate the third display section; at this moment, the right-eye signal of the next frame loaded in the first display section becomes an error signal of cross-talking with the left-eye signal of the current frame loaded in the third display section; since the first display section and the third display section are only spaced by one display section therebetween and the distance is short, the cross-talking is severe; and step d, in which the first and second display sections are loaded with the right-eye signal of the next frame and the third and fourth display sections are loaded with the left-eye signal of the current frame; the fourth backlight section 44 is lit to illuminate the fourth display section; at this moment, the right-eye signal of the next frame loaded in the first and second display sections becomes an error of cross-talking with the left-eye signal of the current frame loaded in the fourth display section; since the first and second display sections are spaced from the fourth display section by only one display section therebetween and the distance is short, the cross-talking is severe. The severeness of cross-talking is different when different backlight section is lit. During the entire process of 3D displaying, the liquid crystal panel 40 repeats the processes of loading a right-eye signal (the previous frame), loading a left-eye signal (the current frame), loading a right-eye signal (the next frame), loading a left-eye signal, loading a right-eye signal, and so on. Since the conventional side-edge backlight sections are set up for sections of even number, when an error signal appears, the influence it imposes on the upper and lower sides is different. In this example, the error signal generated when a backlight section is lit is closer to the upper side and the upper side cross-talking is severe in the liquid crystal panel 40 so that the cross-talking of the liquid crystal panel 40 is unsymmetrical in the vertical direction. Adjustment may be directly made on the liquid crystal panel signal to make backlight section lit at a center of the liquid crystal panel signal. Although the cross-talking of the liquid crystal panel 40 can be made substantially symmetric in the vertical direction, yet due to the number of the backlight sections being even, the quality of image at the center position will be sacrificed and cross-talking gets serious.

SUMMARY OF THE INVENTION

Thus, an object of the present invention is to improve cross-talking by using non-uniformly sized backlight sections in order to enhance displaying quality.

To achieve the object, the present invention provides a side-edge non-uniform backlight module having non-uniformly sized backlight sections. The side-edge backlight module having non-uniformly sized backlight sections comprises backlight sections that have relative sizes satisfying the condition that the backlight sections have higher ranks are of greater sizes, wherein ranking the backlight sections is made by conducting an simulation operation for a process of sectionalized lighting of backlight to display liquid crystal panel signals on the basis of uniformly sized backlight sections according to predetermined liquid crystal panel signals and backlight scanning timing and conducting analysis of the number of zones where an interference signal appears and distance of the interference signal when each of backlight sections is lit in the simulation operation on the basis of uniformly sized backlight sections and ranking the backlight sections according to strength of cross-talking caused by the interference signal when each of the backlight sections is lit so that a backlight section having less strong cross-talking is set with a higher rank.

Wherein, the side-edge backlight module comprises first, second, third, fourth, and fifth backlight sections, among which the third backlight section has the greatest size, the second and fourth backlight sections have the second greatest size, and the first and fifth backlight sections have the third greatest size.

Wherein, the side-edge backlight module comprises first, second, third, and fourth backlight sections, among which the second backlight section has the greatest size, the first backlight section has the second greatest size, the third backlight section has the third greatest size, and the fourth backlight section has the fourth greatest size.

Wherein, the side-edge backlight module is of single short edge incidence.

Wherein, the side-edge backlight module is of dual short edge incidence.

The present invention also provided a side-edge backlight module having non-uniformly sized backlight sections, which comprises backlight sections that have relative sizes satisfying the condition that the backlight sections have higher ranks are of greater sizes, wherein ranking the backlight sections is made by conducting an simulation operation for a process of sectionalized lighting of backlight to display liquid crystal panel signals on the basis of uniformly sized backlight sections according to predetermined liquid crystal panel signals and backlight scanning timing and conducting analysis of the number of zones where an interference signal appears and distance of the interference signal when each of backlight sections is lit in the simulation operation on the basis of uniformly sized backlight sections and ranking the backlight sections according to strength of cross-talking caused by the interference signal when each of the backlight sections is lit so that a backlight section having less strong cross-talking is set with a higher rank;

wherein the side-edge backlight module comprises first, second, third, fourth, and fifth backlight sections, among which the third backlight section has the greatest size, the second and fourth backlight sections have the second greatest size, and the first and fifth backlight sections have the third greatest size; and wherein the side-edge backlight module is of single short edge incidence.

The present invention also provides a method for designing a side-edge backlight module having non-uniformly sized backlight sections, which comprises the following steps:

Step 1: conducting an simulation operation for a process of sectionalized lighting of backlight to display liquid crystal panel signals on the basis of uniformly sized backlight sections according to predetermined liquid crystal panel signals and backlight scanning timing;

Step 2: conducting analysis of the number of zones where an interference signal appears and distance of the interference signal when each of backlight sections is lit in the simulation operation on the basis of uniformly sized backlight sections and ranking the backlight sections according to strength of cross-talking caused by the interference signal when each of the backlight sections is lit so that a backlight section having less strong cross-talking is set with a higher rank; and Step 3: providing a higher-rank backlight section with a relatively larger size.

Wherein, the side-edge backlight module is of single short edge incidence.

Wherein, the side-edge backlight module is of dual short edge incidence.

The present invention provides a side-edge backlight module having non-uniformly sized backlight sections and a design method thereof, which use liquid crystal panel signals and backlight scanning timing to determine the influence on cross-talking caused by each of the backlight sections in order to improve cross-talking and enhance displaying quality through modification of the relative sizes of the backlight sections.

BRIEF DESCRIPTION OF THE DRAWINGS

The technical solution, as well as beneficial advantages, of the present invention will be apparent from the following detailed description of an embodiment of the present invention, with reference to the attached drawings. In the drawings:

FIG. 7A is a schematic view illustrating relative sizes of the backlight sections that are of an odd number for a preferred embodiment of the side-edge backlight module having non-uniformly sized backlight sections according to the present invention;

FIG. 7B is a schematic view illustrating relative sizes of the backlight sections that are of an even number for another preferred embodiment of the side-edge backlight module having non-uniformly sized backlight sections according to the present invention; and FIG. 8 is a flow chart illustrating a design method for a side-edge backlight module having non-uniformly sized backlight sections.

DETAILED DESCRIPTION OF THE PREFERRED EMBODIMENTS

The present invention uses non-uniformly sized backlight sections to improve cross-talking and enhance quality of displaying. Referring to FIG. 8, a flow chart is given to illustrate a design method for a side-edge backlight module having non-uniformly sized backlight sections. The method comprises the following steps:

Step 1: conducting an simulation operation for a process of sectionalized lighting of backlight to display liquid crystal panel signals on the basis of uniformly sized backlight sections according to predetermined liquid crystal panel signals and backlight scanning timing;

Step 2: conducting analysis of the number of zones where an interference signal appears and distance of the interference signal when each of backlight sections is lit in the simulation operation on the basis of uniformly sized backlight sections and ranking the backlight sections according to strength of cross-talking caused by the interference signal when each of the backlight sections is lit so that a backlight section having less strong cross-talking is set with a higher rank; and Step 3: providing a higher-rank backlight section with a relatively larger size.

The method is applicable to for example single short edge incidence backlight module or dual short edge incidence backlight module for designing side-edge backlight module having non-uniformly sized backlight sections.

The design method, as well as a side-edge backlight module having non-uniformly sized backlight sections designed with such a method, will be described with reference to FIGS. 5A, 5B, 6A, 6B, 7A, and 7B.

Figure 1:
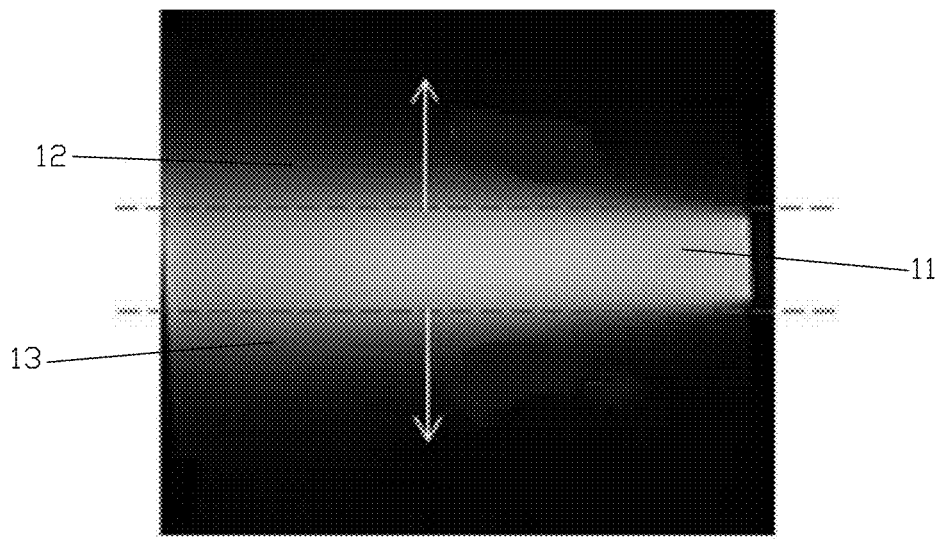
FIG. 1 is a schematic view showing sectionalized lighting and leakage of a conventional side-edge LED backlight.
Figure 2A:
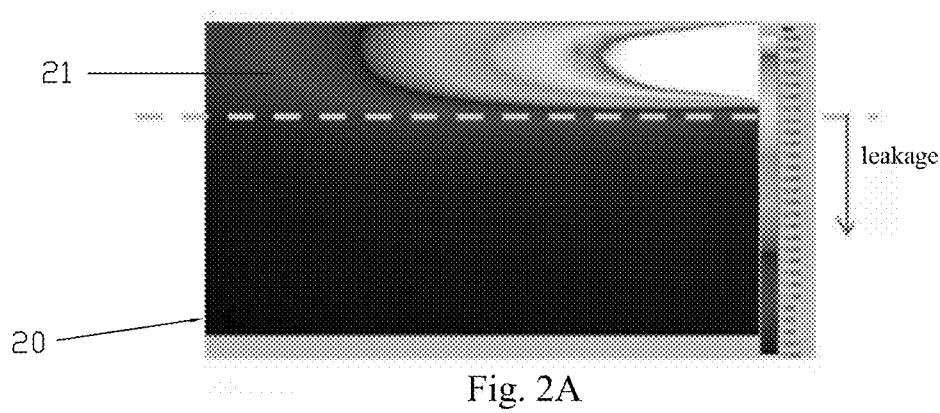
FIGS. 2A and 2B are schematic views illustrating sectionalized backlight lighting of a 46-inch single edge side-edge LED television.
Figure 2B:
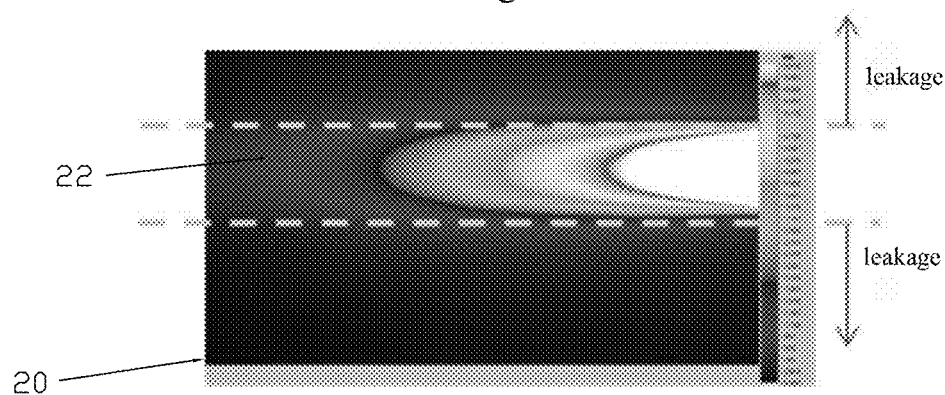
Figure 3:
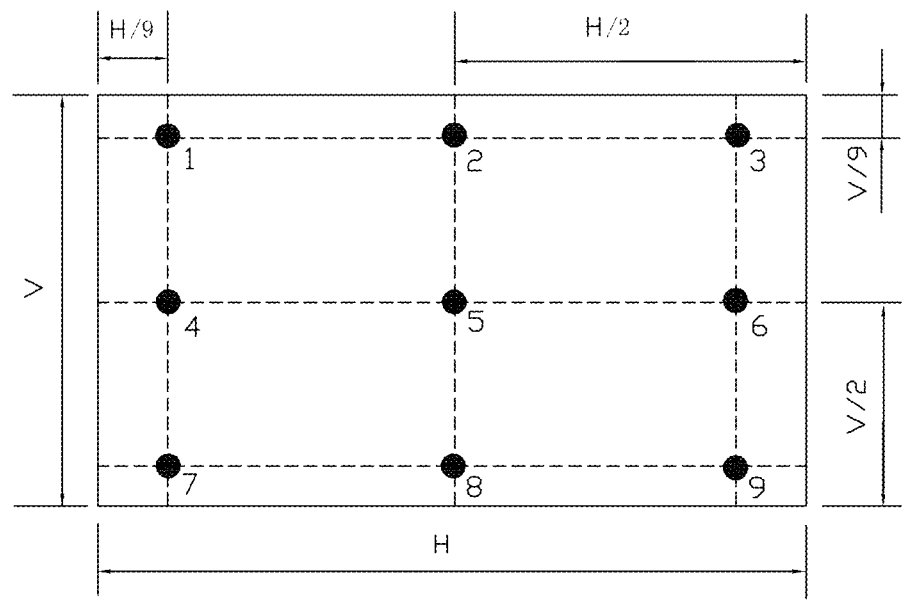
FIG. 3 is a schematic view showing the sites of 9 points on a display screen for measuring cross-talking.
Figure 4:
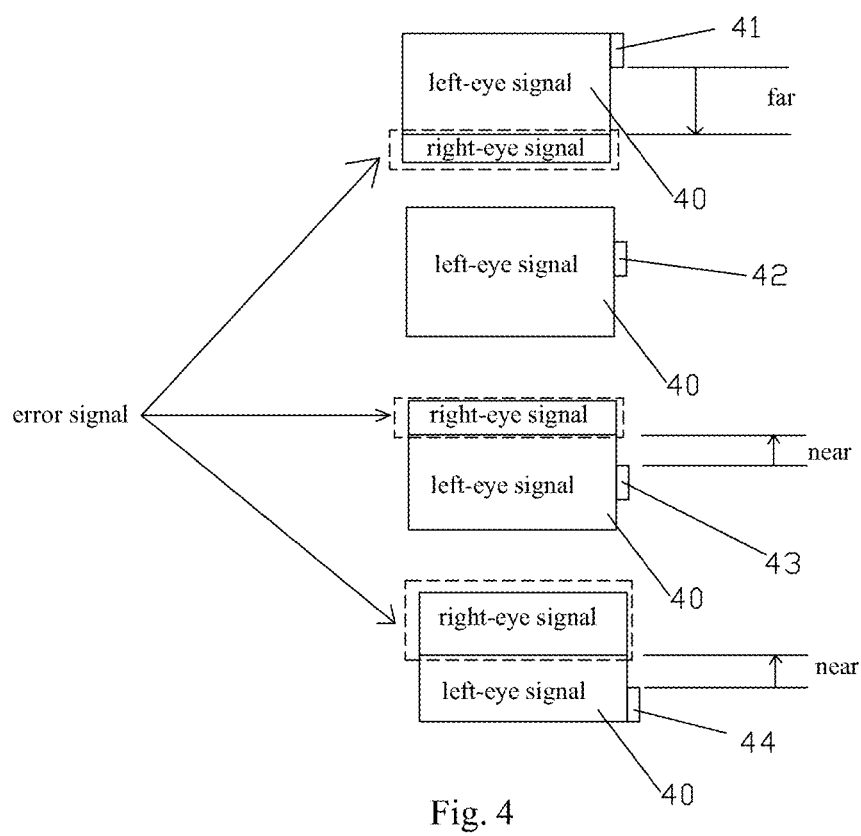
FIG. 4 is a schematic view showing timing relationship (for left-eye signal) between backlight sections of a 46-inch single short edge side-edge LED television and liquid crystal panel signals.
Figure 5A:
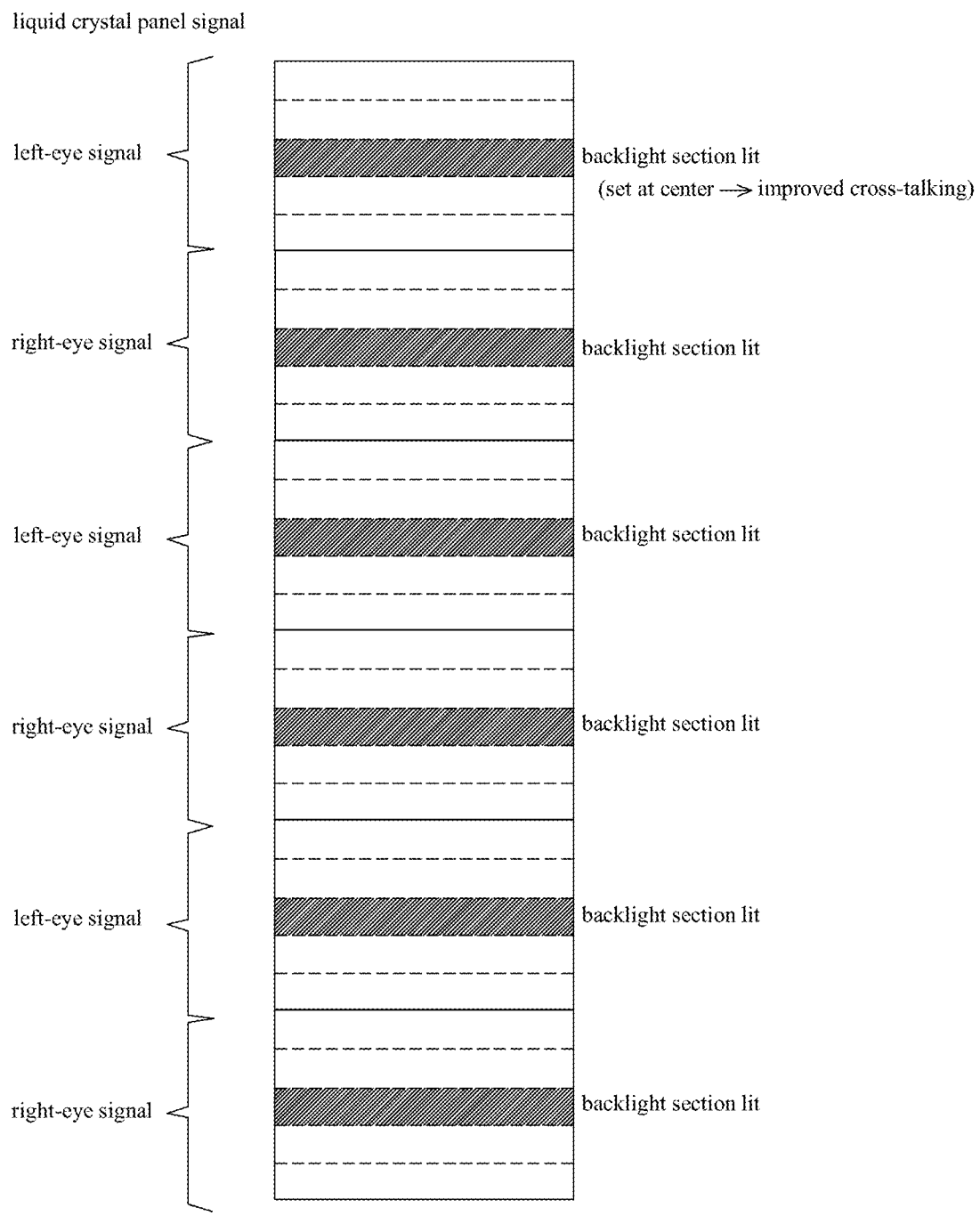
FIGS. 5A and 5B are diagrams illustrating liquid crystal panel signals and backlight scanning timing when the number of backlight sections is odd.
Figure 5B:
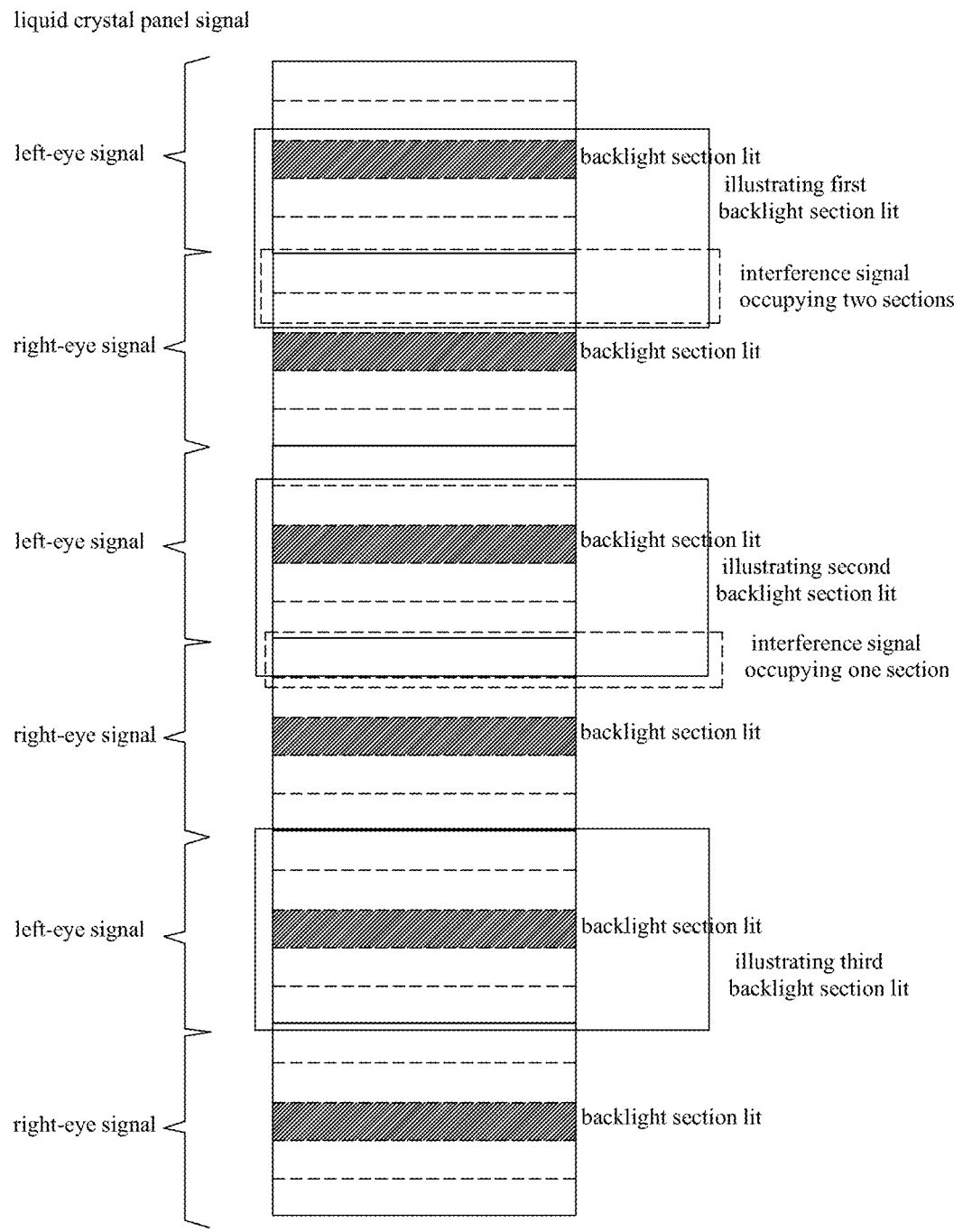

FIGS. 5A and 5B are diagrams showing liquid crystal panel signals and backlight scanning timing where the number of backlight sections is odd. As shown in FIG. 5A, the number of sections used is odd and a specific example of four is given. The left-eye and right-eye liquid crystal panel signals are shown sequentially arranged. The ranges of the left-eye and right-eye signals are indicated by braces. As shown in FIG. 5A, the simulation operation is conducted according to Step 1, where when the backlight is lit, lighting can be selected to be constantly maintained at the center of the liquid crystal panel signal in order to minimize cross-talking. For a backlight module that is composed of 2n+1 (n being a natural number) backlight sections, a liquid crystal panel signal that is correspondingly divided into 2n+1 sections. Maintaining lighting at the center of the liquid crystal panel signal means lighting the n+1th section of the liquid crystal panel signal. In this way, the distance from the previous or next interference signal is the greatest, making the cross-talking minimized. As shown in FIG. 5B, during the cycling process of the liquid crystal panel signals, the first, second, and third sections of backlight are lit separately. The location where the backlight section is lit is indicated by hatching. It is noted from the drawing that the locations, as well as the number thereof, where the interference signals occur are different. In other words, the strength of cross-talking so caused is different, leading to asymmetry of cross-talking. The strength of cross-talking is identical when the second and fourth backlight sections are lit and the strength of cross-talking is also identical when the first and fifth backlight sections are lit. Thus, based on the location where the interference signal occurs, the present invention follows Step 2 to rank the backlight sections according to the strength of the interference signal and then follows Step 3 to modify the relative sizes of the backlight sections by decreasing the size of a backlight section that causes a severer interference signal so as to reduce the strength of the interference caused thereby and thus making the displaying quality approaching symmetry. Thus, a side-edge backlight module having non-uniformly sized backlight sections according to the present invention is completed.

As shown in FIG. 7A, a schematic view is given to illustrate relative sizes of the backlight sections that are of an odd number for a preferred embodiment of the side-edge backlight module having non-uniformly sized backlight sections according to the present invention. In the embodiment, the number of the backlight sections is five. The side-edge backlight module comprises, in sequence, first, second, third, fourth, and fifth backlight sections, and the relative sizes of the backlight sections are modified according to the present invention so that the sizes of the backlight sections are increased from the smallest at the ends to the greatest in the center and are made symmetric in the up-down direction. Among all the backlight sections, the third backlight section has the greatest size, the second and fourth backlight sections have the second greatest size, and the first and fifth backlight sections have the third greatest size.

Although the present invention provides only an example of five backlight sections for illustration, yet the same process can be applied to different numbers of backlight sections to make an analysis for determining the relative sizes. A simulation may then be conducted for minor adjustment. Adopting the side-edge backlight module having non-uniformly sized backlight sections according to the present invention and making displaying according to the predetermined liquid crystal panel signals and backlight scanning timing can apparently improve cross-talking and enhance quality of displaying.

Figure 6A:
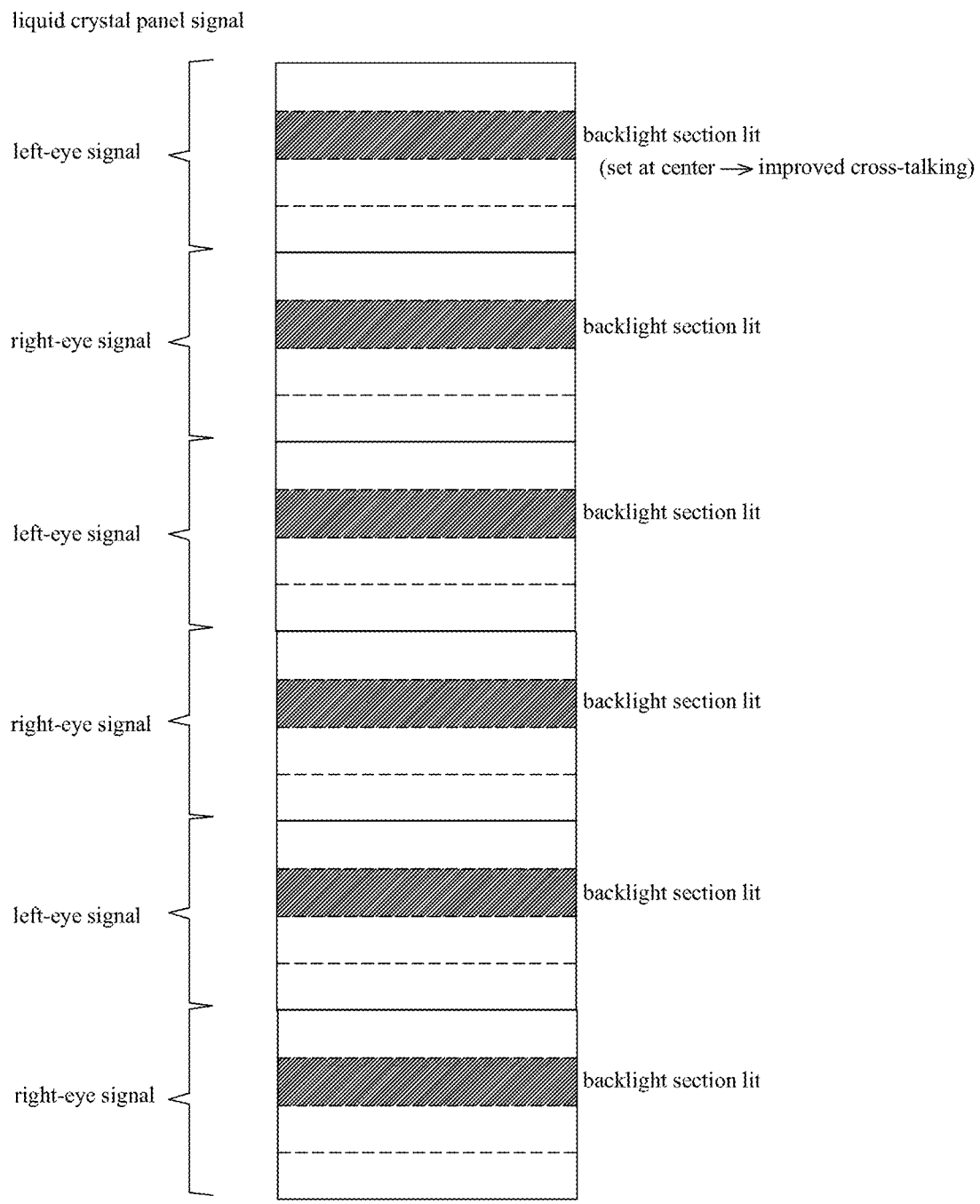
FIGS. 6A and 6B are diagrams illustrating liquid crystal panel signals and backlight scanning timing when the number of backlight sections is even.
Figure 6B:
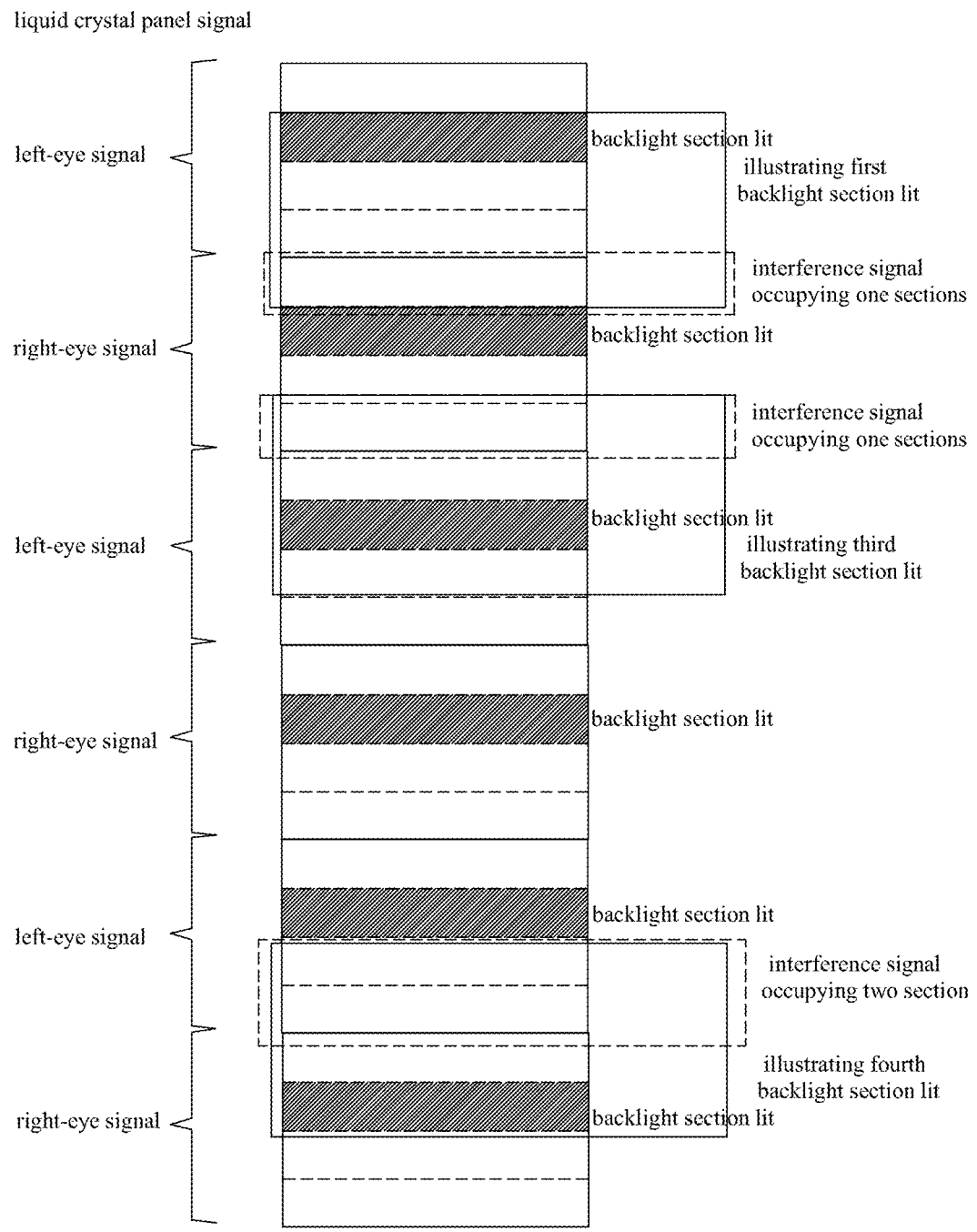

FIGS. 6A and 6B are diagrams showing liquid crystal panel signals and backlight scanning timing where the number of backlight sections is even. As shown in FIG. 6A, the number of sections used is even and a specific example of four is given. The left-eye and right-eye liquid crystal panel signals are shown sequentially arranged. The ranges of the left-eye and right-eye signals are indicated by braces. In FIG. 6A, the sections are of an even number and the location where the backlight section is lit is indicated by hatching. When the backlight is lit, lighting can be selected to be constantly maintained at the second section of the liquid crystal panel signal in order to minimize cross-talking at the center. For a backlight module that is composed of 2n (n being a natural number) backlight sections, lighting of the backlight can be selectively maintained at the nth section of the liquid crystal panel signal, namely being as close to the center of the liquid crystal panel signal as possible, so as to minimize cross-talking at the center. As shown in FIG. 6B, during the cycling process of the liquid crystal panel signals, the locations, as well as the number thereof, where the interference signals occur are different, leading to asymmetry of cross-talking. FIG. 6B shows four different displaying timing (having an even number of sections: four sections), where the first, second, and third sections of backlight are lit separately (the second section being free of interference signal so that the section size can be the greatest). Again, the previously described steps of the present invention are followed to rank the strengths of interference signal occurring when each of the backlight sections is lit in order to modify the relatively sizes of the backlight sections and thus obtaining the relative sizes of the backlight sections shown in FIG. 7B for an even number of backlight sections. In the embodiment, the number of the backlight sections is four, where the side-edge backlight module comprises, in sequence, first, second, third, and fourth backlight sections. Among all the backlight sections, the second backlight section has the greatest size, the first backlight section has the second greatest size, the third backlight section has the third greatest size, and the fourth backlight section has the fourth greatest size.

In summary, the present invention provides a side-edge backlight module having non-uniformly sized backlight sections and a design method thereof, which use liquid crystal panel signals and backlight scanning timing to determine the influence on cross-talking caused by each of the backlight sections in order to improve cross-talking and enhance displaying quality through modification of the relative sizes of the backlight sections.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for designing a side-edge backlight module having non-uniformly sized backlight sections, comprising the following steps:
   (1) conducting an simulation operation by supplying and displaying liquid crystal panel signals on sections of a liquid crystal panel and activating backlight sections of a backlight module on the basis of uniformly sized backlight sections, wherein the backlight sections are arranged side by side in a first direction to collectively define a planar smooth surface having a lateral edge with interfacing lines between the backlight section located on the planar surface and substantially perpendicular to the lateral edge, the backlight sections receiving light projecting from the lateral edge in a second direction that is substantially perpendicular to the first direction and parallel to the planar surface;
   (2) conducting analysis of the number of the sections of the liquid crystal panel where an interference signal appears and distance of the interference signal from the interfered sections of the liquid crystal panel and the section of the liquid crystal panel corresponding to an activated one of the backlight sections and ranking the backlight sections according to strength of cross-talking caused by the interference signal when each of the backlight sections is lit so that a backlight section having less strong cross-talking is set with a higher rank and the backlight sections are ranked according to the strengths of cross-talking that the backlight sections exhibit; and
   (3) providing a higher-rank backlight section with a relatively larger size.

2. The method for designing a side-edge backlight module having non-uniformly sized backlight sections as claimed in claim 1, wherein the side-edge backlight module is of single short edge incidence.

3. The method for designing a side-edge backlight module having non-uniformly sized backlight sections as claimed in claim 1, wherein the side-edge backlight module is of dual short edge incidence.

* * * * *